US007080180B2

(12) United States Patent
Schnabel

(10) Patent No.: US 7,080,180 B2
(45) Date of Patent: Jul. 18, 2006

(54) MODULE FOR INSERTION INTO A DEVICE AND REAR PANEL FOR INSERTION INTO MODULES

(75) Inventor: Dirk Schnabel, München (DE)

(73) Assignee: Siemens Aktiengesellschaft, Munich (DE)

( * ) Notice: Subject to any disclaimer, the term of this patent is extended or adjusted under 35 U.S.C. 154(b) by 206 days.

(21) Appl. No.: 10/486,350

(22) PCT Filed: Aug. 27, 2002

(86) PCT No.: PCT/EP02/09558

§ 371 (c)(1),
(2), (4) Date: Feb. 9, 2004

(87) PCT Pub. No.: WO03/021975

PCT Pub. Date: Mar. 13, 2003

(65) Prior Publication Data
US 2004/0210690 A1 Oct. 21, 2004

(30) Foreign Application Priority Data
Aug. 28, 2001 (EP) .................................. 01120509

(51) Int. Cl.
G06F 13/00 (2006.01)
G06F 13/12 (2006.01)
H01R 24/00 (2006.01)
G06F 1/26 (2006.01)

(52) U.S. Cl. ...................... 710/301; 710/62; 439/941

(58) Field of Classification Search ........ 710/300–304, 710/52, 62; 345/204; 439/941, 947; 365/206, 365/63, 189.11, 69; 370/201, 916; 361/679, 361/686; 709/218, 253
See application file for complete search history.

(56) References Cited

U.S. PATENT DOCUMENTS

| 4,980,860 | A | * | 12/1990 | Houston et al. | ........ | 365/189.11 |
| 5,406,512 | A | * | 4/1995 | Kagenishi | .................. | 365/149 |
| 5,983,294 | A | | 11/1999 | Kim et al. | | |
| 6,120,330 | A | * | 9/2000 | Gwiazdowski | .............. | 439/676 |
| 6,319,069 | B1 | * | 11/2001 | Gwiazdowski | .............. | 439/676 |
| 6,932,655 | B1 | * | 8/2005 | Hatterscheid et al. | ........ | 439/676 |
| 2004/0013013 | A1 | * | 1/2004 | Beer et al. | .................. | 365/200 |
| 2004/0108998 | A1 | * | 6/2004 | Imamura | .................... | 345/204 |
| 2004/0210690 | A1 | * | 10/2004 | Schnabel | .................... | 710/62 |

FOREIGN PATENT DOCUMENTS

EP 0 460 626 B1 11/1991

OTHER PUBLICATIONS

"Digital implementation of a transmit line build-out circuit for DSX-1 interface" by Borys et al. (abstract only) Publication Date: May 11-12, 1988.*

* cited by examiner

Primary Examiner—Gopal C. Ray

(57) ABSTRACT

A module for inserting into a device with a rear panel comprising a crossed pair of electric lines with a first line and a second line is provided. The module can be connected to the lines of the crossed pair of electric lines by means of a respective plug-in connection. According to the invention, the module comprises a device that compensates for the crossing of the pair of electric lines in the rear panel.

10 Claims, 2 Drawing Sheets

MODULE FOR INSERTION INTO A DEVICE AND REAR PANEL FOR INSERTION INTO MODULES

CROSS REFERENCE TO RELATED APPLICATIONS

This application is the US National Stage of International Application No. PCT/EP02/09558, filed Aug. 27, 2002 and claims the benefit thereof. The International Application claims the benefits of European application No. 01120509.3 filed Aug. 28, 2001, both of the applications are incorporated by reference herein in their entirety.

FIELD OF INVENTION

This invention relates to a module and a rear panel in accordance with the preamble of independent claims.

BACKGROUND OF INVENTION

Modularly constructed electrical devices can be adapted to specific tasks by inserting different modules into them. Thus for example a telephone switching system can be adapted to a specified number of extensions by inserting a sufficient number of modules. Typically the modules communicate via a rear panel with one another, as is shown schematically in FIG. 1. On the rear panel a distinction is made between bidirectional lines 1 and unidirectional lines 2a and 2b. On each side both a transmitter 4a and 5a and also a receiver 4b and 5b respectively are connected to a bidirectional line. Unidirectional lines are driven on one side by a transmitter 6a and 7a and on their other side are connected to a receiver 6b or 7b.

If two modules with the same electrical interface communicate with one another it is necessary to avoid one line being simultaneously operated by two transmitters. A bidirectional line on the rear panel can connect two corresponding plug-in connections of the two modules with one another since by activating or deactivating the transmitter for this plug-in connection care is taken that a maximum of one transmitter is driving the line.

Unidirectional lines will typically be crossed on the rear panel so that, although the corresponding plug-in connections on the two modules could possibly be driven by two transmitters, they are however linked to two other plug-in connections of the other modules in each case, as is shown in FIG. 1 for lines 2a and 2b. Thus in FIG. 1 line 2a connects transmitter 6a with receiver 6b. Correspondingly line 2b connects transmitter 7a with receiver 7b.

If a new generation of modules is now developed the number of bidirectional and unidirectional connections is fixed by the rear panel. When identical modules are used a bidirectional pair of lines cannot be used for two unidirectional signals since in this case two transmitters would drive the same line or one line would connect the inputs of two receivers with one another. Without changing the rear panel and in accordance with the conventional technology only one bidirectional signal can be sent via a pair of crossed wires on the rear panel since by crossing the lines the signal is not sent and received via the corresponding plug-in connectors.

If the new generation of modules is to be more powerful then as a rule a higher data rate is also to be transmitted via the rear panel. This could be done by providing a larger number of connections or by converting from unidirectional lines into bidirectional lines. Conventionally therefore a redesign of the rear panel has been necessary in which for example crossed lines have been replaced by uncrossed lines. However replacing the rear panel leads to the electrical device having to be temporally taken out of service and thus the replacement of the rear panel has resulted in long periods of interruptions in service. By contrast modules are designed so that they can be changed even when the device is in operation.

SUMMARY OF INVENTION

The task of the invention is therefore to specify a module, a rear panel and a bidirectional multiplexer which allow the development of a more powerful generation of modules without redesigning the rear panel.

This object is achieved by a module in accordance with the independent claims.

BRIEF DESCRIPTION OF THE DRAWINGS

Preferred embodiments of this invention are explained in more detail below using the enclosed diagrams. The diagrams show.

DETAILED DESCRIPTION OF INVENTION

Figure 1:
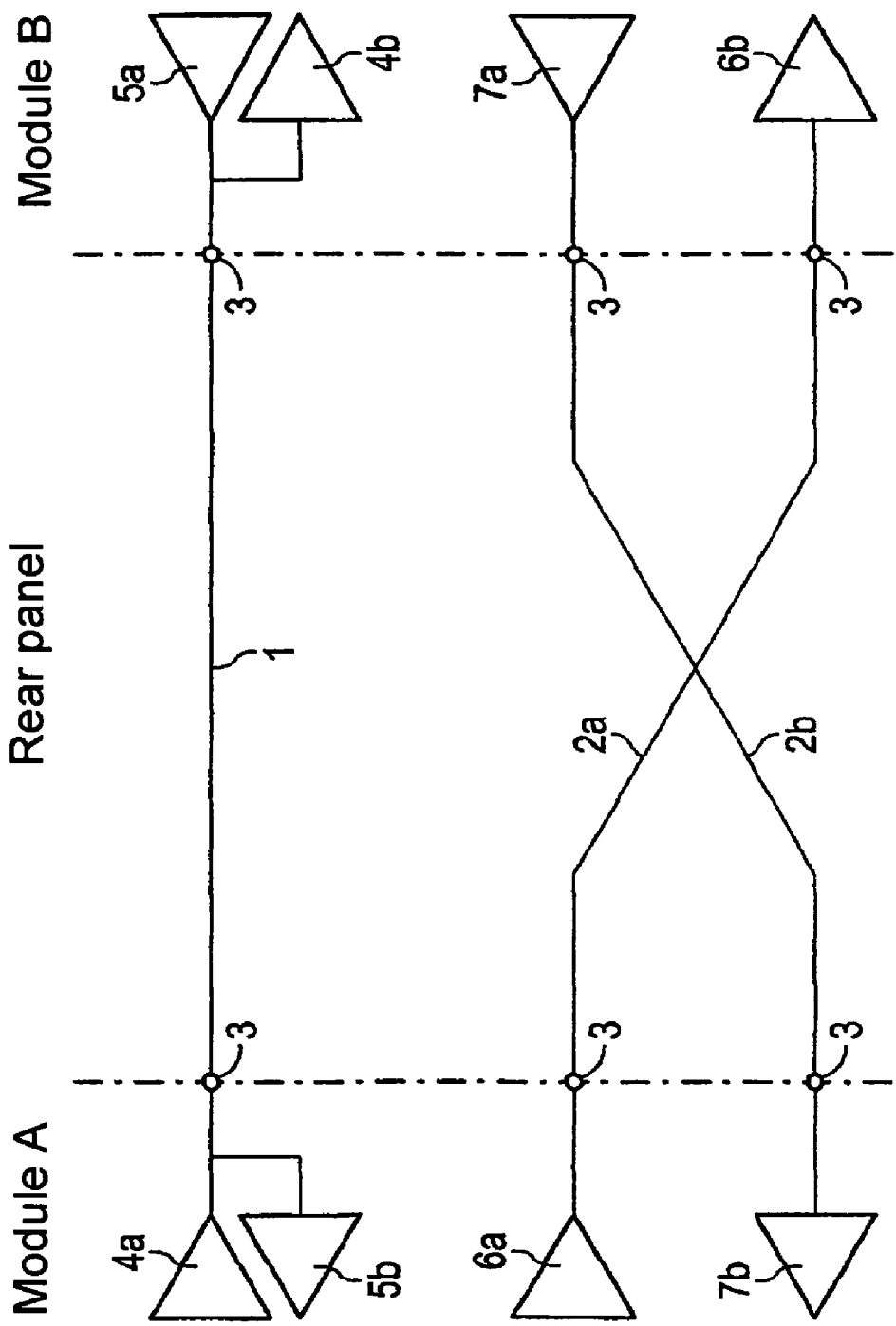
FIG. 1: Schematically shows the electrical connection of two modules A and B via a rear panel using a bidirectional line and two unidirectional lines.

The invention is essentially based on the fact that the crossing of two lines initially used unidirectionally is compensated for in one of the modules connected via the rear panel. In the simplest case this can be done by reversing on one module the terminals for the connections relative to the other module. This swapping can for example be implemented simply by connecting terminal B of IO buffer 25 (IO stands for input/output) with connector 24 and terminal A of IO buffer 23 with connector 26 in FIG. 2. In accordance with this embodiment of the invention the connecting lines are not only crossed on the rear panel but also on module B. Both crossings are highlighted. In this embodiment the bidirectional multiplexers 12 and 22 are not necessary. This embodiment has the disadvantage however that two different modules have to be developed and manufactured, namely one with crossed connections and the other with uncrossed connections. Servicing will also be more complicate it since different modules have to be kept in reserve and if the incorrect module is inserted the function of the electronic device could be disturbed or even the device itself destroyed.

Figure 2:
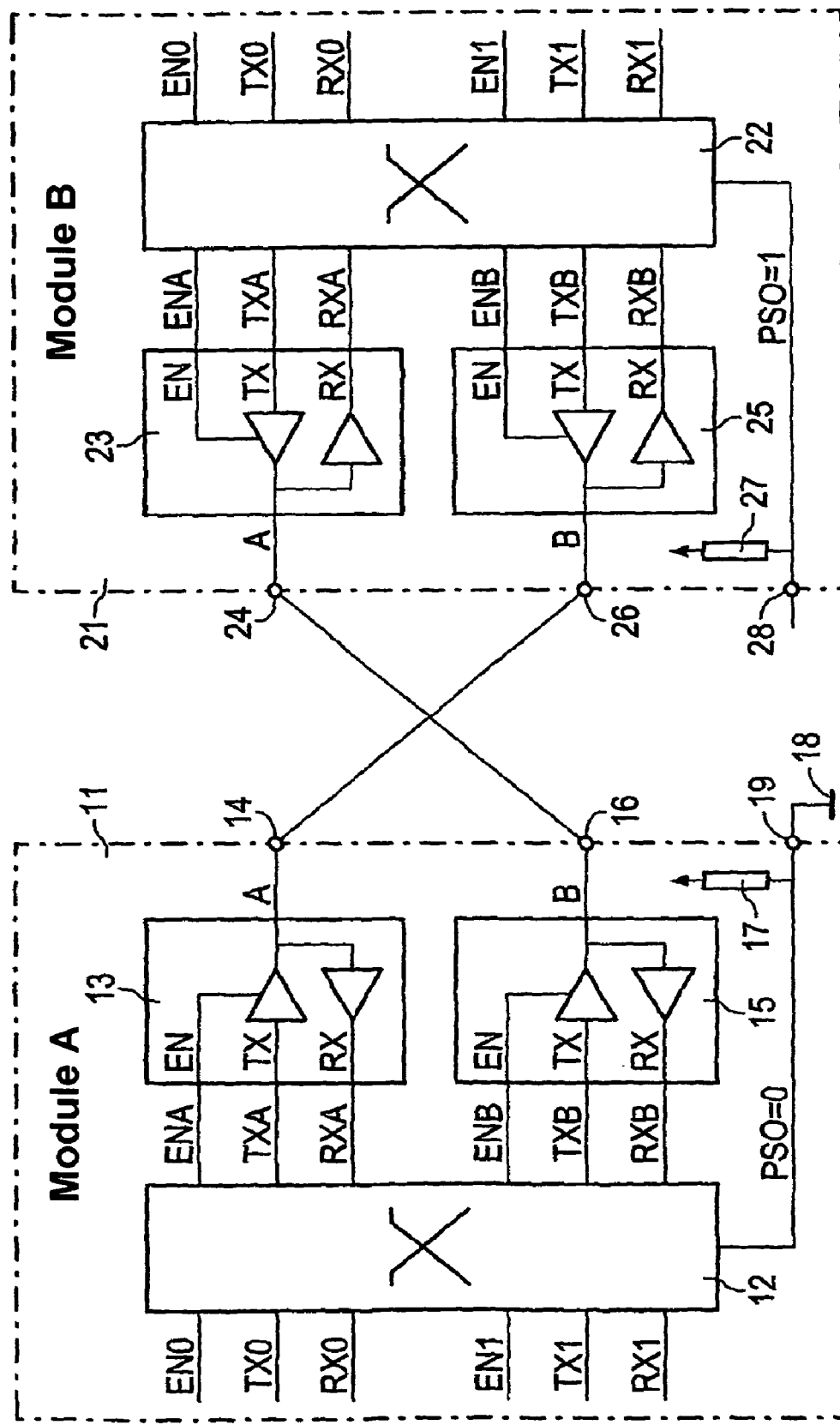
FIG. 2: Two modules A and B that are each equipped with a bidirectional multiplexer to compensate for the crossing of the two connecting lines.

Therefore the embodiment shown in FIG. 2 is advantageous since at least the electronic interface of modules A and B is identical and consequently the entire modules can also be identical.

FIG. 2 shows as an example control of a pair of lines crossed on the rear panel, in which case each line can transmit signals in both directions. This is achieved by the IO buffers 13, 15, 23 and 25.

Each of these buffers contains an activatable transmitter with inputs EN and TX. The transmitters receive the data to be transmitted via inputs TX. Inputs EN are used for activating the relevant transmitter. The transmitters can be equipped in an embodiment with tri-state outputs. In another embodiment the transmitter can consist of an AND gate and a transistor with open collector or drain. Here the lines are preferably connected on the rear panel to the appropriate supply voltage that is either to ground or preferably to 5V. The receivers provided in the IO buffers which supply the output signals RX can for example be realized by inverters.

A bidirectional multiplexer 12 or 22 is provided in both module A and module B respectively. A control signal POS is fed to each of the two bidirectional multiplexers. In addition each multiplexer provides four groups of terminals with each terminal group comprising three terminals ENx, TXx and RXx. "x" stands for 0, 1, A or B in accordance with the relevant group of terminals. The switching characteristics of multiplexers 12 and 22 can be found in

TABLE 1

| Inputs | POS = 0 Module A) outputs | POS = 1 Module B) outputs |
| --- | --- | --- |
| ENA | EN0 | EN1 |
| TXA | TX0 | TX1 |
| RX0 | RXA | RXB |
| ENB | EN1 | EN0 |
| TXB | TX1 | TX0 |
| RX1 | RXB | RXA |

Table 1 shows that in Module A in which the control signal POS has the value 0, terminals EN0, TX0, RX0, EN1, TX1, RX1 are connected to terminals ENA, TXA, RXA, ENB, TXB or RXB by multiplexer 12. Since with module B the control signal POS has the value 1 that is the operating voltage is positive, multiplexer 22 crosses the terminal groups. Terminals EN0, TX0, RX0, EN1, TX1 and RX1 are thus connected to terminals ENB, TXB, RXB, ENA, TXA or RXA.

The control signal POS is thus generated, depending on the position on the rear panel in which the module is inserted, by connector contact 19 of one position being connected to ground via ground connection 18 while contact 28 in the rear panel is left open. Within the module the resistors 17 or 27 are provided via which the line for the control signal is connected to the positive operating voltage, i.e. preferably 5V. Resistors 17 or 27 ensure that the control line is at a defined voltage even if connector 28 on the rear panel is not connected.

In another embodiment connector 28 on the rear panel can be connected to the positive operating voltage. In this embodiment resistors 17 and 27 are not required.

Terminal Group A with terminals ENA, TXA and RXA as well as terminal group B with terminals ENB, TXB and RXB of the bidirectional multiplexers 12 and 22 are adapted to the control line EX, the send data line EX as well as the corresponding IO buffer. If the logic levels of terminal Group 0 with terminals EN0, TX0 and RX0 and terminal group 1 with terminals EN1, TX1, RX1 correspond to the logic levels of the terminals of the IO buffer, multiplexers 12 and 22 can be simply incorporated into the modules in a redesign.

In the preferred form of embodiment bidirectional multiplexers 12 and 22 consist of six individual multiplexers each of which has two inputs and one output. Each output ENA, TXA, RX0, ENB, TXB and RX1 is connected to an output of an individual multiplexer. One input of the individual multiplexer in each case of which the outputs are connected with terminals ENA and ENB, is connected to the terminals EN0 and EN1. Accordingly the two individual multiplexers are connected for terminals TXx. One input of the individual multiplexer in each case that are connected to outputs RX0 and RX1 are connected to outputs RXA and RXB.

In another embodiment a bidirectional multiplexer can be connected between terminals A and B of IO buffer 13 and 15 and connectors 14 and 16. Such a multiplexer must consist of two bidirectional individual multiplexers.

In all embodiments of this invention the interface components, that is the bidirectional multiplexers 12 and 22 as well as the IO buffers 13, 15, 23 and 25 operate so that the terminals EN0 through RX1 in module 11 are connected transparently with the terminals EN0 through RX1 in module 21.

The above embodiments merely describe the circuitry of a pair of lines crossed on the rear panel to allow bidirectional operation of each line of the pair. In addition to this pair of lines any number of bidirectional uncrossed lines as well as any number of line pairs crossed on the rear panel can be present of which in their turn some are operated unidirectionally and the rest bidirectionally.

That invention claimed is:

1. A module for insertion into a device comprising:
a rear panel having a crossed line pair with a first line and a second line, the module adapted to be connected via one plug-in connector to the first and second lines; and
a device that compensates for the crossing of the pair of lines in the rear panel.

2. A module in accordance with claim 1, wherein with each plug-in connection for the crossed pair of lines, the output of an activatable transmitter and the input of a receiver are connected, and each transmitter is only activated when no third transmitter connected to the output of the transmitter via the corresponding line of the rear panel is activated.

3. A module in accordance with claim 2, wherein the activatable transmitter and the receiver which are connected to the same connector form an IO buffer component featuring two inputs and one output.

4. A module in accordance with claim 3, wherein the device that compensates for the crossing of the pairs of lines in the rear panel is formed by a bidirectional multiplexer.

5. A module in accordance with claim 1, wherein the device that compensates for the crossing of the pairs of lines in the rear panel is formed by a bidirectional multiplexer.

6. A module in accordance with claim 4, wherein a further connector is provided via which the multiplexer receives the information as to whether or not it should swap the signals received from the first line or sent over this line with the signals received from the second line or sent over this line.

7. A module in accordance with claim 5, wherein with each plug-in connection for the crossed pair of lines, the output of an activatable transmitter and the input of a receiver are connected, and each transmitter is only activated when no third transmitter connected to the output of the transmitter via the corresponding line of the rear panel is activated, and wherein the activatable transmitter and the receiver which are connected to the same connector form an IO buffer component featuring two inputs and one output, and wherein the multiplexer features four groups of terminals of which two are connected to the IO buffer components that in their turn are connected to the lines of a crossed pair of lines.

8. A module in accordance with claim 6, wherein with each plug-in connection for the crossed pair of lines the output of an activatable transmitter and the input of a receiver are connected and each transmitter is only activated when no third transmitter connected to the output of the transmitter via the corresponding line of the rear panel is activated, and wherein the activatable transmitter and the receiver which are connected to the same connector form an IO buffer component featuring two inputs and one output, and wherein the multiplexer features four groups of terminals of which two are connected to the IO buffer components that in their turn are connected to the lines of a crossed pair of lines.

9. A module in accordance with claim 2, wherein the device that compensates for the crossing of the pairs of lines in the rear panel is formed by a bidirectional multiplexer.

10. A rear panel for inserting two largely identical modules comprising a plurality of plug-in connectors in the same geometrical arrangement being provided for each module and a pair of plug-in connectors for the first module being connected to the corresponding pair of connectors for the second module via crossed lines, wherein one plug-in connector for the first module is connected on the rear panel to a specific potential and the corresponding connector for the second module is connected on the rear panel to another potential or is unconnected on the rear panel.

* * * * *